US005624979A

United States Patent [19]
Kleiner et al.

[11] Patent Number: 5,624,979
[45] Date of Patent: Apr. 29, 1997

[54] STABILIZED PHOSPHORUS-MODIFIED EPOXY RESINS AND THEIR USE

[75] Inventors: Hans-Jerg Kleiner, Kronberg; Dieter Regnat, Eppstein, both of Germany

[73] Assignee: Hoechst Aktiengesellschaft, Frankfurt, Germany

[21] Appl. No.: 577,232

[22] Filed: Dec. 22, 1995

[30] Foreign Application Priority Data

Dec. 30, 1994 [DE] Germany ............... 44 47 277.3

[51] Int. Cl.$^6$ ................ C08G 59/14; C08L 63/00
[52] U.S. Cl. ................ 523/453; 523/454; 523/455; 523/456; 525/507; 528/104; 528/108; 528/398; 428/413
[58] Field of Search .................. 528/104, 108, 528/398; 523/456, 453, 454, 455; 525/507; 428/413

[56] References Cited

FOREIGN PATENT DOCUMENTS

WO94/21704  9/1994  WIPO .

Primary Examiner—Frederick Krass
Attorney, Agent, or Firm—Connolly & Hutz

[57] ABSTRACT

The present invention relates to phosphorus-modified epoxy resins having an epoxide value of 0 to about 1 mol/100 g containing structural units which are derived from (A) polyepoxide compounds having at least two epoxide groups per molecule and (B) phosphinic and/or phosphonic acid anhydrides, wherein at least one phenolic antioxidant is admixed to them. The phosphorus-modified epoxy resins stabilized in this way are distinguished by an increased storage stability, in particular at higher temperatures.

The invention furthermore relates to the use of these stabilized, phosphorus-modified epoxy resins for the production of shaped articles, coatings or laminates.

18 Claims, No Drawings

STABILIZED PHOSPHORUS-MODIFIED EPOXY RESINS AND THEIR USE

Phosphorus-containing epoxy resins are of importance for the production of flame-resistant reactive resin molded materials and coatings having a high level of thermal, mechanical and electrical properties and for the production of laminates (cf. PCT Patent Application WO 94/21704). In addition to their flame resistance, they are distinguished above all by very processing-friendly properties, since they have, inter alia, a good storage stability. Nevertheless, the storage stability is in need of improvement, since it is not always completely satisfactory, especially at high temperatures.

The present invention thus relates to phosphorus-modified epoxy resins of improved storage stability, in particular at higher temperatures, which have an epoxide value of 0 to about 1 mol/100 g and contain structural units which are derived (A) from polyepoxide compounds having at least two epoxide groups, preferably terminal epoxide groups, per molecule and (B) from phosphinic and/or phosphonic acid anhydrides, wherein at least one phenolic antioxidant is admixed with them.

The phosphorus-modified epoxy resins employed according to the invention, which are thus adducts of compounds according to (A) and to (B), in general, depending on the epoxy resin, have a phosphorus content of about 0.5 to 13% by weight, based on the resin. This phosphorus content can be adjusted as required by the molar ratio of polyepoxide compound to phosphinic acid anhydride/phosphonic acid anhydride. The requirement that on average preferably at least one epoxide group should be contained per molecule of the phosphorus-modified epoxy resin can furthermore be realized by the functionality of the epoxy resin used.

The phosphorus-modified epoxy resins employed according to the invention preferably have a phosphorus content of about 1 to 8% by weight, in particular about 2 to 5% by weight, based on the resin. They are preferably curable. On average, they preferably contain at least one epoxide group, in particular 1 to 3 epoxide groups, per molecule; the average functionality is accordingly preferably at least 1, in particular 1 to 3. The epoxide value is preferably about 0.02 to 1 mol/100 g, particularly preferably about 0.02 to 0.6 mol/100 g. The phosphorus-modified epoxy resins according to the invention furthermore in general have an average molecular weight $\overline{M}_n$ (number-average; determined by means of gel chromatography; polystyrene standard) of up to about 10000, preferably of about 200 to 5000, and in particular of about 400 to 2000.

The phosphorus-modified epoxy resins employed according to the invention are practically non-crosslinked. The gel content in them in general does not exceed 5% by weight, and is preferably less than 1% by weight.

The average molecular weight $\overline{M}_n$ (number-average; likewise determined by means of gel chromatography; polystyrene standard) of the structural units (A) is in general up to about 9000, and is preferably between abut 150 and 4000, in particular between about 300 and 1800; they are preferably derived from polyepoxide compounds having on average 2 to 6 epoxide groups per molecule (a functionality of 2 to 6). These polyepoxide compounds are preferably polyglycidyl ethers based on aromatic amines, polyhydric phenols, hydrogenation products of these phenols and/or on novolaks (in this context, cf. below).

The structural units (B) are preferably derived from phosphinic acid anhydrides of the formulae (I) and/or (II)

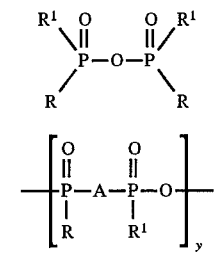
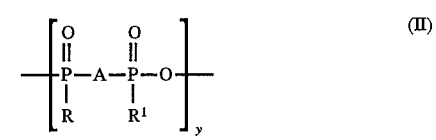

in which

R and $R^1$ independently of one another are a hydrocarbon radical having 1 to 20 carbon atoms, preferably 1 to 10 carbon atoms, which can have an aliphatic and/or aromatic character and can be interrupted by heteroatoms or heteroatom groups, preferably a saturated or unsaturated, straight-chain or branched aliphatic radical, such as alkyl, alkenyl or cycloalkyl, having preferably 1 to 8 carbon atoms, in particular 1 to 6 carbon atoms, such as methyl, ethyl, n- and i-propyl, n-, i- and tert-butyl and the various pentyls and hexyls, or an aryl or aralkyl radical, such as phenyl or naphthyl which are substituted or substituted by preferably 1 to 3 alkyl radicals having 1 to 6 carbon atoms, or such as phenylalkyl having 1 to 6 carbon atoms in the alkyl radical, for example benzyl;

A is a divalent hydrocarbon radical having 1 to 10 carbon atoms, preferably 1 to 6 carbon atoms, and in particular 1 to 4 carbon atoms, which can have an aliphatic and/or aromatic character and can be interrupted by heteroatoms or heteroatom groups, preferably a divalent saturated or unsaturated, straight-chain or branched aliphatic radical, and in particular an alkylene radical, such as methylene, propylene and the like, and y is an integer of at least 1, preferably 1 to 100, and in particular 1 to 30, and wherein if y=1, the bridge member A preferably has at least 2 carbon atoms.

The structural units (B) furthermore are preferably derived from phosphonic acid anhydrides of the formula (III)

in which $R^3$ has the same meaning as $R/R^1$ according to the formulae (I) and (II) and z is at least 3, preferably 3 to 100, and in particular 20 to 60. If appropriate, in addition to these structural units, those which are derived from phosphinic acid anhydrides of the above formulae (I) and/or (II) can also be present.

According to a preferred embodiment, the phosphorus-modified epoxy resin of the invention essentially has the structure expressed by the following formulae (IV), (V) and/or (VI)

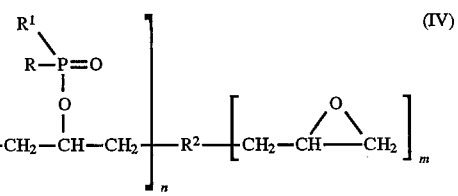

-continued

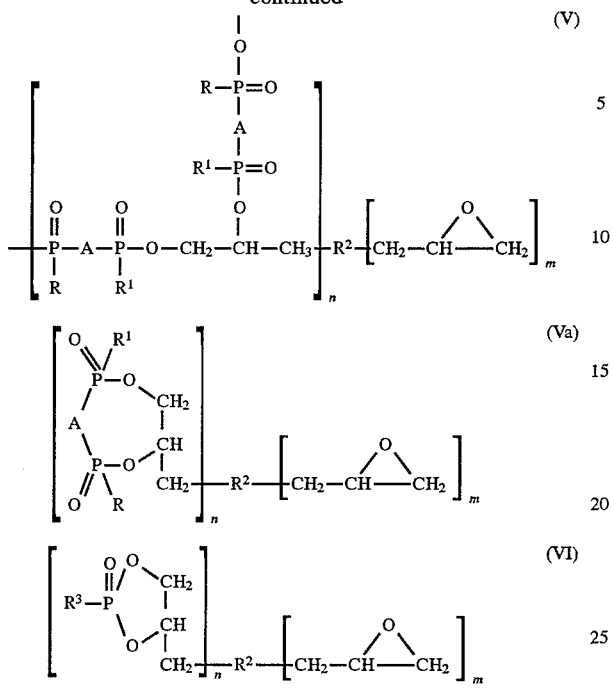

in which

R, R¹ and R³ have the same meaning as under the above formulae (I) to (III);

R² is the radical of a polyepoxide compound reduced by the glycidyl groups;

n=integers from 1 to 5, preferably 1 to 3; and m=integers from 1 to 5, preferably 1 to 3, and wherein the sum n+m should be an integer from 2 to 6, preferably 2 to 4.

For example, R² is the (n+m)-valent radical, reduced by the glycidyl groups, of a polyether, a polyether-polyol, a polyester or a polyester-polyol;

of a hydrocarbon radical which can have a saturated or unsaturated aliphatic character and/or aromatic character and can be interrupted by heteroatoms, such as oxygen and nitrogen, and by heteroatom groups, such as —NR¹CO— (R¹ has the same meaning as above)

and/or can contain these, wherein this hydrocarbon radical, which as a rule contains at least 6, preferably at least 12 to 30, carbon atoms, preferably contains aryl groups, in particular phenyl groups, which can be substituted, but are preferably unsubstituted; or of a reaction product of an epoxide compound with polyamines, polyols, polycaprolactone-polyols, polyesters containing OH groups, polyethers, polyglycols, hydroxyl-, carboxyl- and amino-functional polymer oils, polycarboxylic acids or hydroxyl- or amino-functional polytetrahydrofurans.

R² can also be different radicals of these types.

R² is preferably the corresponding radical of a bisphenol A diglycidyl ether, of a bisphenol F diglycidyl ether or of oligomers thereof, of a polyglycidyl ether of phenol/formaldehyde or cresol/formaldehyde novolak, or of a diglycidyl ester of tetrahydrophthalic, phthalic, isophthalic or terephthalic acid, and mixtures of these radicals.

Some of these radicals R² are shown by way of their formula below:

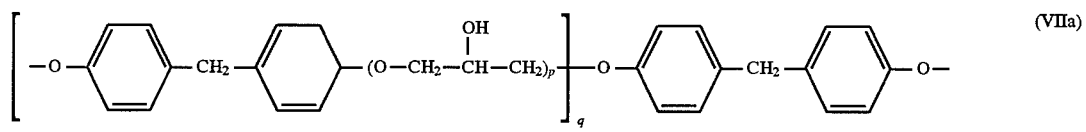 (VIIa)

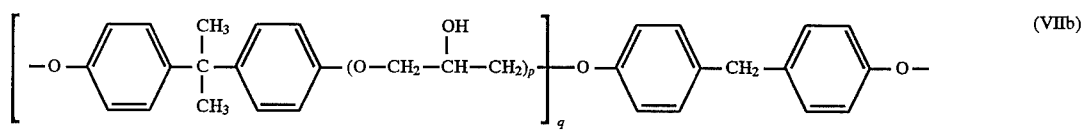 (VIIb)

 (VIIc)

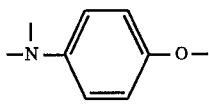

(VIId)

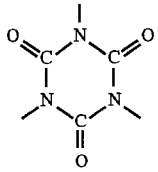

(VIIe)

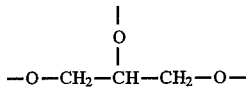

(VIIf)

—CH₂—R⁵—CH₂—   (R⁵ = (CH₂)ᵣ, or cyclohexylene    (VIIg)

in which R⁴ is hydrogen and/or a C₁—to C₁₀-alkyl radical, and the indices n and m have the meaning according to formulae (IV) to (VI), the index p is 0 or 1, the index q is integers from 0 to 40, preferably 0 to 10, and the index r is integers from 4 to 8.

The phosphorus-modified epoxy resins employed according to the invention can be prepared by reaction of the polyepoxide compounds according to (A) with the phosphinic and/or phosphonic acid anhydrides according to (B), preferably in an inert solvent (diluent) or else, with an appropriate reaction procedure, in bulk, as described in the abovementioned PCT Patent Application WO 94/21704, to which reference is made here. According to a variant likewise described in this patent application, the phosphorus-modified epoxy resins in which, in this case, the structural units (B) are derived only from phosphonic acid anhydrides can be prepared by splitting off alcohol, at temperatures of at least 80° C., from phosphorus-modified epoxides containing structural units which are derived from polyepoxide compounds having at least two epoxide groups per molecule and from phosphonic acid half-esters. This splitting off of alcohol is preferably carried out at temperatures of 80° to 250° C., in particular at 100° to 150° C., and under reduced pressure, preferably 100 to 0.1 mm Hg, in particular 5 to 0.5 mm Hg. This splitting off of alcohol can be accelerated by addition of transesterification catalysts.

The polyepoxide compounds which are used for preparation of the phosphorus-modified epoxy resins and are preferably halogen-free can be saturated or unsaturated and aliphatic, cycloaliphatic, aromatic and/or heterocyclic. They can furthermore contain those substituents which do not cause troublesome side reactions under the mixing or reaction conditions, for example alkyl or aryl substituents, ether groupings or the like. It is also possible to use mixtures of different polyepoxide compounds.

These polyepoxide compounds preferably have the formula (VIII)

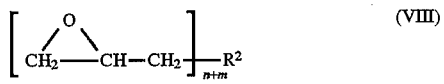

(VIII)

in which R² and the indices n and m have the meaning according to the formulae (IV) to (VI).

These polyepoxide compounds are, for example, polyglycidyl ethers based on polyhydric, preferably dihydric, alcohols or phenols, hydrogenation products of these phenols and/or on novolaks (reaction products of mono- or polyhydric phenols, such as phenol and/or cresols, with aldehydes, in particular formaldehyde, in the presence of acid catalysts), which are obtained in a known manner, for example by reaction of the particular polyols with epichlorohydrin.

Polyhydric phenols which may be mentioned here, for example, are: resorcinol, hydroquinone, 2,2-bis-(4-hydroxyphenyl)-propane (bisphenol A), isomer mixtures of dihydroxydiphenylmethane (bisphenol F), 4,4'-dihydroxydiphenylcyclohexane, 4,4'-dihydroxy-3,3'-dimethyldiphenylpropane, 4,4'-dihydroxybiphenyl, 4,4'-dihydroxybenzophenone, bis-(4-hydroxyphenyl)-1,1-ethane, bis-(4-hydroxyphenyl)-1,1'-isobutane, bis-(4-hydroxy-tert.-butylphenyl)-2,2-propane, bis-(2-hydroxynaphthyl)-methane, 1,5-dihydroxynaphthalene, tris-(4-hydroxyphenyl)-methane and bis-(4-hydroxyphenyl) 1,1'-ether. Bisphenol A and bisphenol F are preferred here.

The polyglycidyl ethers of polyhydric aliphatic alcohols are also suitable as the polyepoxide compound. Examples which may be mentioned of such polyhydric alcohols are 1,4-butanediol, 1,6-hexanediol, polyalkylene glycols, glycerol, trimethylolpropane, bis-(4-hydroxycyclohexyl)-2,2-propane and pentaerythritol.

Further possible polyepoxide compounds are also (poly) glycidyl esters, which are obtained by reaction of epichlorohydrin or similar epoxide compounds with an aliphatic, cycloaliphatic or aromatic polycarboxylic acid, such as oxalic acid, adipic acid, glutaric acid, phthalic, isophthalic, terephthalic, tetrahydrophthalic or hexahydrophthalic acid, 2,6-naphthalenedicarboxylic acid and dimerized fatty acids. Examples of these are terephthalic acid diglycidyl ester and hexahydrophthalic acid diglycidyl ester.

Polyepoxide compounds which contain the epoxide groups in random distribution over the molecular chain and which can be prepared by emulsion copolymerization using olefinically unsaturated compounds containing these epoxide groups, such as, for example, glycidyl esters of acrylic or methacrylic acid, can also advantageously be employed in some cases.

Other polyepoxide compounds which can be used are, for example, those based on heterocyclic ring systems, such as, for example, hydantoin epoxy resins, triglycidyl isocyanurate and/or oligomers thereof, triglycidyl-p-aminophenol, triglycidyl-p-aminodiphenyl ether, tetraglycidyldiaminodiphenylmethane, tetraglycidyldiaminodiphenyl ether, tetrakis(4-glycidoxyphenyl)-ethane, urazole epoxides, uracil epoxides and oxazolidinone-modified epoxy resins. Furthermore polyepoxides based on aromatic amines, such as aniline, for example N,N-diglycidylaniline, diaminodiphenylmethane and N,N'-dimethylaminodiphenylmethane or sulfone.

Polyepoxide compounds which are preferably employed are bisglycidyl ethers based on bisphenol A, bisphenol F and bisphenol S (reaction products of these bisphenols and epichloro(halogeno)hydrin) or oligomers thereof, polyglycidyl ethers of phenol/formaldehyde and/or cresol/ formaldehyde novolaks and diglycidyl esters of phthalic, isophthalic, terephthalic, tetrahydrophthalic and/or hexahydrophthalic acid.

The phosphinic acid anhydrides used for the reaction with the polyepoxide compound preferably have the formulae (I) and/or (II). Representatives which may be mentioned here are: dimethylphosphinic acid anhdyride, ethylmethylphosphinic acid anhydride, diethylphosphinic acid anhydride, dipropylphosphinic acid anhydride, ethylphenylphosphinic acid anhydride and diphenylphosphinic acid anhdyride. Examples of suitable bisphosphinic acid anhydrides are: ethane-1,2-bismethylphosphinic acid anhydride, ethane-1,2-bisphenylphosphinic acid anhydride, propane-1,3-bismethylphosphinic acid anhydride, butane-1,4-bismethylphosphinic acid anhydride, hexane-1,6-bismethylphosphinic acid anhydride and decane-1,10-bismethylphosphinic acid anhydride.

Possible phosphonic acid anhydrides, which have the formula (III), are, for example: methanephosphonic acid anhydride, ethanephosphonic acid anhydride, n- and/or i-propanephosphonic acid anhydride, hexanephosphonic acid anhydride, octanephosphonic acid anhydride, decanephosphonic acid anhydride and benzenephosphonic acid anhydride.

Reference is made to the PCT Patent Application WO 94/21704 mentioned with regard to further details of the preparation of the phosphorus-modified epoxy resins filed according to the invention, including the preparation of the precursors which is incorporated by reference herein.

Phenolic antioxidants which can be employed are the compounds usually known for this purpose. Examples which may be mentioned here are:

1. Alkylated monophenols, for example 2,4-di-t-butylphenol, 2,6-di-t-butylphenol, 2,6-di-t-butyl-4-methylphenol, 2-t-butyl-4,6-dimethylphenol, 2,6-di-t-butyl-4-ethylphenol, 2,6-di-t-butyl-4-i-butylphenol, 2,6-di-cyclopentyl-4-methylphenol, 2-(α-methylcyclohexyl)-4,6-dimethylphenol, 2,6-di-octadecyl-4-methylphenol, 2,4,6-tri-cyclohexylphenol and 2,6-di-t-butyl-4-methoxymethylphenol;
2. Hydroquinone or alkylated hydroquinones, for example 4-methoxyphenol, 2,6-di-t-butyl-4 -methoxyphenol, 2,5-di-t-butyl-hydroquinone, 2,5-di-t-amyl-hydroquinone and 2,6 -diphenyl-4-octadecyloxyphenol;
3. Hydroxylated diphenyl thioethers, for example 2,2'-thio-bis-(6-t-butyl-4-methylphenol), 2,2'-thio-bis-(4-octylphenol), 4,4'-thio-bis-(6-t-butyl-3-methylphenol) and 4,4'-thio-bis-(6-t-butyl-2-methylphenol);
4. Alkylidene-bisphenols, for example 2,2'-methylene-bis-(6-t-butyl-4-methylphenol), 2,2'-methylene-bis(6-t-butyl-4-ethylphenol), 2,2'-methylene-bis-[4-methyl-6-(α-methylcyclohexyl)-phenol], 2,2'-methylene-bis-(4-methyl-6-cyclohexylphenol), 2,2'-methylene-bis-(6-nonyl-4-methylphenol), 2,2'-methylene-bis-(4,6-di-t-butylphenol), 2,2'-ethylidene-bis-(4,6-di-t-butylphenol), 2,2'-ethylidene-bis-(6-t-butyl-4-isobutylphenol), 2,2'-methylene-bis-[6-(α-methylbenzyl)-4-nonylphenyl], 2,2'-methylene-bis-[6-(α,α-dimethylbenzyl)-4-nonylphenol], 4,4'-methylene-bis-(2,6-di-t-butylphenol), 4,4,'-methylene-bis-(6-t-butyl-2-methylphenol), 1,1-bis-(5-t-butyl-4-hydroxy-2-methylphenyl)-butane, 2,6-di-(3-t-butyl-5-methyl-2-hydroxybenzyl)-4-methylphenol, 1,1,3-tris-(5-t-butyl-4-hydroxy-2-methylphenyl)-butane, 1,1-bis-(5-t-butyl-4-hydroxy-2-methylphenyl)-3-n-dodecylmercaptobutane, di-(3-t-butyl-4-hydroxy-5-methylphenyl)-dicyclo-pentadiene and di-[2-(3'-t-butyl-2'-hydroxy-5'-methyl-benzyl)-6-t-butyl-4-methyl-phenyl] terephthalate;
5. benzyl compounds, for example 1,3,5-tri-(3,5-di-t-butyl-4-hydroxybenzyl)-2,4,6-trimethylbenzene, di-(3,5-di-t-butyl-4-hydroxybenzyl) sulfide, isooctyl 3,5-di-t-butyl-4-hydroxybenzyl-mercaptoacetate, bis-(4-t-butyl-3-hydroxy-2,6-dimethylbenzyl) dithiolterephthalate, 1,3,5-tris-(3,5-di-t-butyl-4-hydroxybenzyl) isocyanurate, 1,3,5-tris-(4-t-butyl-3-hydroxy-2,6-dimethylbenzyl) isocyanurate, dioctadecyl 3,5-di-t-butyl-4-hydroxybenzyl-phsphonate and the calcium salt of 3,5-di-t-butyl-4-hydroxybenzyl-phosphonic acid monoethyl ester;
6. Acylaminophenols, for example 4-hydroxy-lauric acid anilide, 4-hydroxy-stearic acid anilide, 2,4-bis-octyl-mercapto-6-(3,5-di-t-butyl-4-hydroxy-anilino)-s-triazine and octyl N-(3,5-di-t-butyl-4-hydroxyphenyl)-carbamate;
7. Esters of β-(3,5-di-t-butyl-4-hydroxyphenyl)-propionic acid with monohydric alcohols, such as, for example, with methanol or octadecanol;
8. Esters of β-(5-t-butyl-4-hydroxy-3-methylphenyl)-propionic acid with monohydric alcohols, such as, for example, with methanol or octadecanol;
9. Amides of β-(3,5 -di-t-butyl-4-hydroxyphenyl)-propionic acid, such as, for example N,N'-di-(3,5-di-t-butyl-4-hydroxyphenylpropionyl)-hexamethylenediamine, N,N'-di-(3,5-di-t-butyl-4-hydroxyphenylpropionyl)-trimethylenediamine and N,N'-di-(3,5-di-t-butyl-4-hydroxyphenylpropionyl)-hydrazine.

The phenolic antioxidants can also be employed in any desired mixture with one another.

Preferred possible antioxidants are: hydroquinone, 4-methoxyphenol, 2,4-di-t-butylphenol and 2,6-di-t-butylphenol.

The antioxidants are incorporated into the phosphorus-modified epoxy resins by generally customary methods, for example by mixing in. They can also be added in the form of a masterbatch. The amount of antioxidant required for the stabilization is in general 0,005 to 5% by weight, preferably 0.05 to 2% by weight, based on the resin. The storage stability, determined, for example, from the increase in viscosity of a corresponding solution, of the phosphorus-modified epoxy resins, in particular at higher temperatures, is surprisingly significantly increased by admixing the antioxidants. Since the action of the phenolic antioxidants is based on prevention of the formation of free radicals, it was not to be expected that epoxy resins are stabilized by addition of these antioxidants, since epoxy resins should react to ionic but not to free radical influences.

The stabilized phosphorus-modified epoxy resins according to the invention can advantageously be used as flame-retardant additives (reactive resins) in many fields of use for the production of shaped articles, prepregs, coatings or laminates (composite materials), in particular for insulation purposes in electrical engineering. These phosphorus-modified epoxy resins can also be employed here as a mixture with phosphorus-free epoxy resins in amounts of up to 80% by weight, preferably up to 50% by weight. The known epoxy hardeners such as are described, for example, in DE Laid-Open Specification 2 743 680 or EP Laid-Open Specification 274 646 can be used as hardeners. These materials are suitable, for example, for covering, coating and encasing electronic components, for insulating electrical coils, and for the production of insulating components and composite materials with fibrous intermediate layer components, in particular laminates for printed circuit boards.

EXAMPLE

The viscosity can be regarded as a measure of the storage stability. It is determined by the Höppler method and given in mPa.s [25° C.]. An epoxidized novolak reacted with propanephosphonic acid anhydride and having an epoxide value of 0.37 (mol/100 g) and a phosphorus content of 3.4% is employed. Approximately 75% strength solutions result from this with methyl ethyl ketone and ethyl acetate. The lower the viscosity, the higher the content of the solvents.

a) The viscosity of a solution having a viscosity of 311 mPa.s [25° C.] on the day of preparation is measured as a function of time without and with addition of 0.3% of 4-methoxyphenol at room temperature.

| Viscosity mPa.s [25° C.]: | | Period of |
|---|---|---|
| without addition | with addition | time [months] |
| 311 | 311 | start |
| 370 | 347 | 3 |
| 370 | 335 | 6 |
| 413 | 362 | 9 | b) The viscosity of a solution of 623 mPa.s [25°C.] on the day of preparation is measured as a function of time without and with addition of 0.3% of 4-methoxyphenol at room temperature

| Viscosity mPa.s [25° C.]: | | Period of |
|---|---|---|
| without addition | with addition | time [months] |
| 623 | 623 | start |
| 670 | 638 | 1 |
| 659 | 637 | 2 |
| 694 | 640 | 4 |
| 773 | 695 | 5 | c) The viscosity of a solution of 707 mPa.s [25° C.] on the day of preparation is measured as a function of time without and with addition of 0.3% of 2,4-di-t-butylphenol at 40° C.

| Viscosity mPa.s [25° C.]: | | Period of |
|---|---|---|
| without addition | with addition | time [months] |
| 707 | 707 | start |
| 765 | 719 | 1 |
| 928 | 832 | 2 |
| 905 | 826 | 4 |

The experiments clearly show that the increase in viscosity during storage at room temperature and 40° C. is significantly higher without the addition of the antioxidants than with addition of these additives.

The epoxide value is not changed by the storage conditions.

We claim:

1. A phosphorus-modified epoxy resin having an epoxide value of 0.02 to 1 mol/100 g obtained by reacting components (A) and (B) at a temperature from −20° to 130° C.

(A) polyepoxide compounds having 2 to 6 epoxide groups per molecule and having an average molecular weight $M_n$ of 150 to 4,000 and (B) phosphinic and/or phosphonic acid anhydrides of the formula (I), (II) and/or III

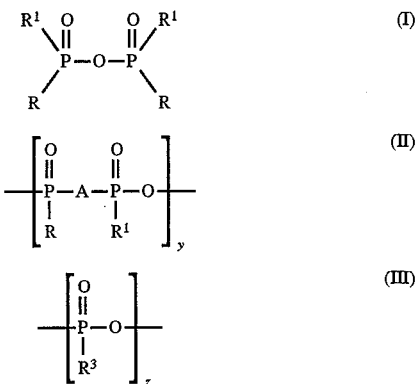

in which

R, $R^1$ and $R^3$ independently of one another are a hydrocarbon radical having 1 to 20 carbon atoms, A is a divalent hydrocarbon radical having 1 to 10 carbon atoms y is an integer of at least 1 z is a least 3, and wherein at least one phenolic antioxidant is admixed therewith.

2. A phosphorus-modified epoxy resin as claimed in claim 1, wherein the amount of phenolic antioxidant is 0.005 to 5% by weight, based on the resin.

3. A phosphorus-modified epoxy resin as claimed in claim 1, wherein the phenolic antioxidant is hydroquinone, 4-methoxyphenol, 2,4-di-t-butylphenol, 2,6-di-t-butylphenol or corresponding mixtures thereof.

4. A phosphorus-modified epoxy resin as claimed in claim 1, wherein the phosphorus content is 0.5 to 13% by weight, based on the resin.

5. A phosphorus-modified epoxy resin as claimed in claim 1, which contains on average at least one epoxide group per molecule.

6. A phosphorus-modified epoxy resin as claimed in claim 1, wherein the average molecular weight $\overline{M}_n$ of the resin is between 200 and 5000.

7. A phosphorus-modified epoxy resin as claimed in claim 1, wherein the polyepoxide compound (A) is selected from the group consisting of polyglycidyl ethers based on polyhydric phenols, hydrogenation products of these phenols or on novolaks, and mixtures thereof.

8. A phosphorus-modified epoxy resin having an epoxide value of 0.02 to 1 mol/100 g, obtained by reacting components (A) and (B) at a temperature from −20° to 130° C., (A) polyepoxide compounds having 2 to 6 epoxide groups per molecule and having an average molecular weight $M_n$ of 150 to 4000, and (B) phosphinic and/or phosphonic acid anhydrides, the phosphorus content being 0.5 to 13% by weight, based on the resin, and the average molecular weight $M_n$ of the resin being between 200 and 5000, which comprises 0.005 to 5% by weight, based on the resin, of a phenolic antioxidant selected from the group consisting of hydroquinone, 4-methoxyphenyl, 2,4-di-t-butylphenol, 2,6-di-t-butylphenol and corresponding mixtures thereof.

9. A method of using the phosphorus-modified epoxy resin as claimed in claim 1 for the production of shaped articles, coatings, prepregs or laminates which comprises adding the phosphorus-modified epoxy resin as claimed in claim 1, to a composite material which becomes the shaped articles, coatings, prepregs or laminate.

10. A shaped article, coating or laminate produced from a phosphorus-modified epoxy resin as claimed in claim 1.

11. A phosphorus-modified epoxy resin as claimed in claim 1, wherein (B) is a phosphinic acid anhydride of the formula (I) and/or (II)

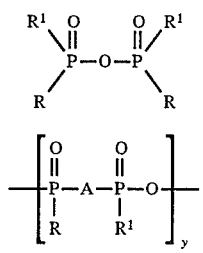

in which

R and R¹ independently of one another are a hydrocarbon radical having 1 to 20 carbon atoms, A is a divalent hydrocarbon radical having 1 to 10 carbon atoms, and y is an integer of at least 1.

12. A phosphorus-modified epoxy resin as claimed in claim 1, wherein (B) is a phosphonic acid anhydride of the formula (III)

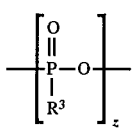

in which $R^3$ is a hydrocarbon radical having 1 to 20 carbon atoms, and z is at least 3.

13. The phosphorus-modified epoxy resin as claimed in claim 11, wherein R and R' independently of one another are a hydrocarbon radical having 1 to 6 carbon atoms, A is a divalent hydrocarbon radical having 1 to 6 carbon atoms, and y is an integer from 1 to 100.

14. The phosphorus-modified epoxy resin as claimed in claim 12, wherein z is from 3 to 100.

15. A phosphorus-modified epoxy resin as claimed in claim 1, which has the formula (IV), (V), (Va) or (VI) or mixtures thereof,

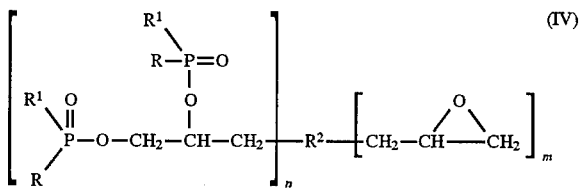

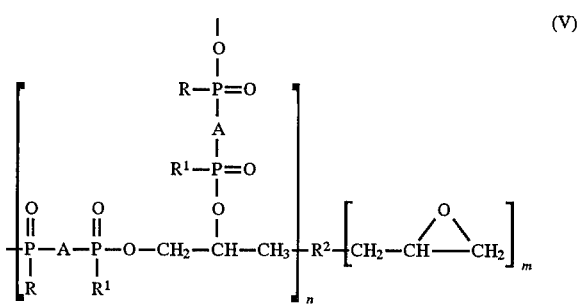

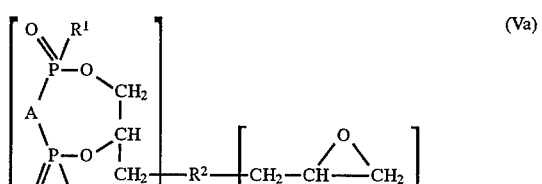

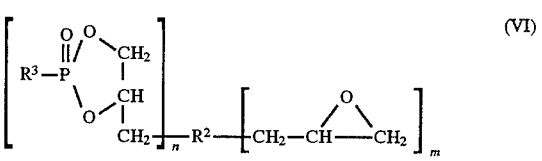

in which

R, $R^1$ and $R^3$ independently of one another are a hydrocarbon radical having from 1 to 20 carbon atoms;

$R^2$ is the radical of a polyepoxide compound reduced by the glycidyl groups;

A is a divalent hydrocarbon radical having 1 to 10 carbon atoms;

n=an integer from 1 to 5;

m=an integer of from 1 to 5, and wherein the sum n+m is an integer from 2 to 6.

16. A phosphorus-modified epoxy resin having an epoxide value of 0.02 to 1 mol/100 g obtained by reacting components (a) and (b) at a temperature from 80° to 250° C., (a) polyepoxide compounds having 2 to 6 epoxide groups per molecule and having an average molecular weight $M_n$ of 150 to 4,000 and (b) phosphonic acid half-esters, and splitting off alcohol from the resulting reaction product, wherein at least one phenolic antioxidant is admixed therewith.

17. The phosphorus-modified epoxy resin as claimed in claim 1, wherein the phenolic antioxidant is selected from the group consisting of alkylated monophenols, hydroquinone, alkylated hydroquinones, hydroxylated diphenyl thioethers, alkylidenebisphenols, benzyl compounds, acylaminophenols, esters of β-(3,5-di-t-butyl-4-hydroxyphenyl)-propionic acid with monohydric alcohols, esters of β-(5-t-butyl-4-hydroxy-3-methylphenyl)-propionic acid with monohydric alcohols, amides of β-(3,5-di-t-butyl-4-hydroxyphenyl)-propionic acid, and corresponding mixtures thereof.

18. The phosphorus-modified epoxy resin of claim 15 having formula (VI).

* * * * *